(12) United States Patent
Chen et al.

(10) Patent No.: US 10,943,804 B2
(45) Date of Patent: Mar. 9, 2021

(54) MONITORING OF PROCESS CHAMBER

(71) Applicant: Taiwan Semiconductor Manufacturing Co., Ltd., Hsinchu (TW)

(72) Inventors: Bo-Chen Chen, Hsinchu (TW); Sheng-Wei Wu, Zhubei (TW); Yung-Li Tsai, Houlong Town (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/454,619

(22) Filed: Jun. 27, 2019

(65) Prior Publication Data

US 2020/0006101 A1 Jan. 2, 2020

Related U.S. Application Data

(60) Provisional application No. 62/692,229, filed on Jun. 29, 2018.

(51) Int. Cl.
| | |
|---|---|
| *H01L 21/67* | (2006.01) |
| *G06T 7/00* | (2017.01) |
| *G01N 21/95* | (2006.01) |
| *G01N 21/956* | (2006.01) |

(52) U.S. Cl.
CPC ... *H01L 21/67253* (2013.01); *G01N 21/9501* (2013.01); *G01N 21/95607* (2013.01); *G06T 7/001* (2013.01); *H01L 21/6708* (2013.01); *H01L 21/67051* (2013.01); *H01L 21/67248* (2013.01); *H01L 21/67282* (2013.01); *G01N 2021/95615* (2013.01); *G06T 2207/30148* (2013.01)

(58) Field of Classification Search
CPC .......................... H01L 21/67253; H01L 22/12
See application file for complete search history.

(56) References Cited

U.S. PATENT DOCUMENTS

| | | | | |
|---|---|---|---|---|
| 7,084,970 | B2 * | 8/2006 | Weiss | G01N 21/95 |
| | | | | 356/237.4 |
| 8,092,695 | B2 * | 1/2012 | Grimbergen | C23F 4/00 |
| | | | | 216/12 |
| 9,735,035 | B1 * | 8/2017 | Ranjan | H01L 21/76862 |
| 9,852,955 | B2 * | 12/2017 | Gehles | H01L 22/24 |
| 10,395,882 | B1 * | 8/2019 | Moody | H01J 29/481 |
| 10,408,744 | B2 * | 9/2019 | Atanasoff | C23C 14/547 |
| 10,541,184 | B2 * | 1/2020 | Jung | H01L 21/67253 |

\* cited by examiner

*Primary Examiner* — William Coleman
(74) *Attorney, Agent, or Firm* — Sterne, Kessler, Goldstein & Fox P.L.L.C.

(57) ABSTRACT

The present disclosure describes a method for controlling a wet processing system includes dispensing one or more chemicals into a processing chamber according to one or more process parameters. The method also includes injecting one or more illumination markers into the processing chamber and obtaining images representing locations of the one or more illumination markers. The method further includes determining a trajectory of an illumination marker of the one or more illumination markers based on the images and determining whether the determined trajectory is outside a predetermined trajectory range. In response to the determined trajectory being outside the predetermined trajectory range, the method further includes adjusting the one or more process parameters.

20 Claims, 4 Drawing Sheets

MONITORING OF PROCESS CHAMBER

CROSS-REFERENCE TO RELATED APPLICATION

This application claims the benefit of U.S. Provisional Patent Application No. 62/692,229, titled "System and Method for Three-dimensional Visualization and Monitoring of a Chamber," which was filed on Jun. 29, 2018 and is incorporated herein by reference in its entirety.

BACKGROUND

Semiconductor wafers undergo numerous processing operations during wafer fabrication processing in an integrated circuit (IC) fabrication facility. Processing chambers can be used to perform the processing operations, such as etching and cleaning of semiconductor wafers. Temperature and chemical flow can vary within a processing chamber and cause non-uniformity in semiconductor wafer processing.

BRIEF DESCRIPTION OF THE DRAWINGS

Aspects of the present disclosure are best understood from the following detailed description when read with the accompanying figures. It is noted that, in accordance with common practice in the industry, various features are not drawn to scale. In fact, the dimensions of the various features may be arbitrarily increased or reduced for clarity of discussion.

DETAILED DESCRIPTION

Figure 1:
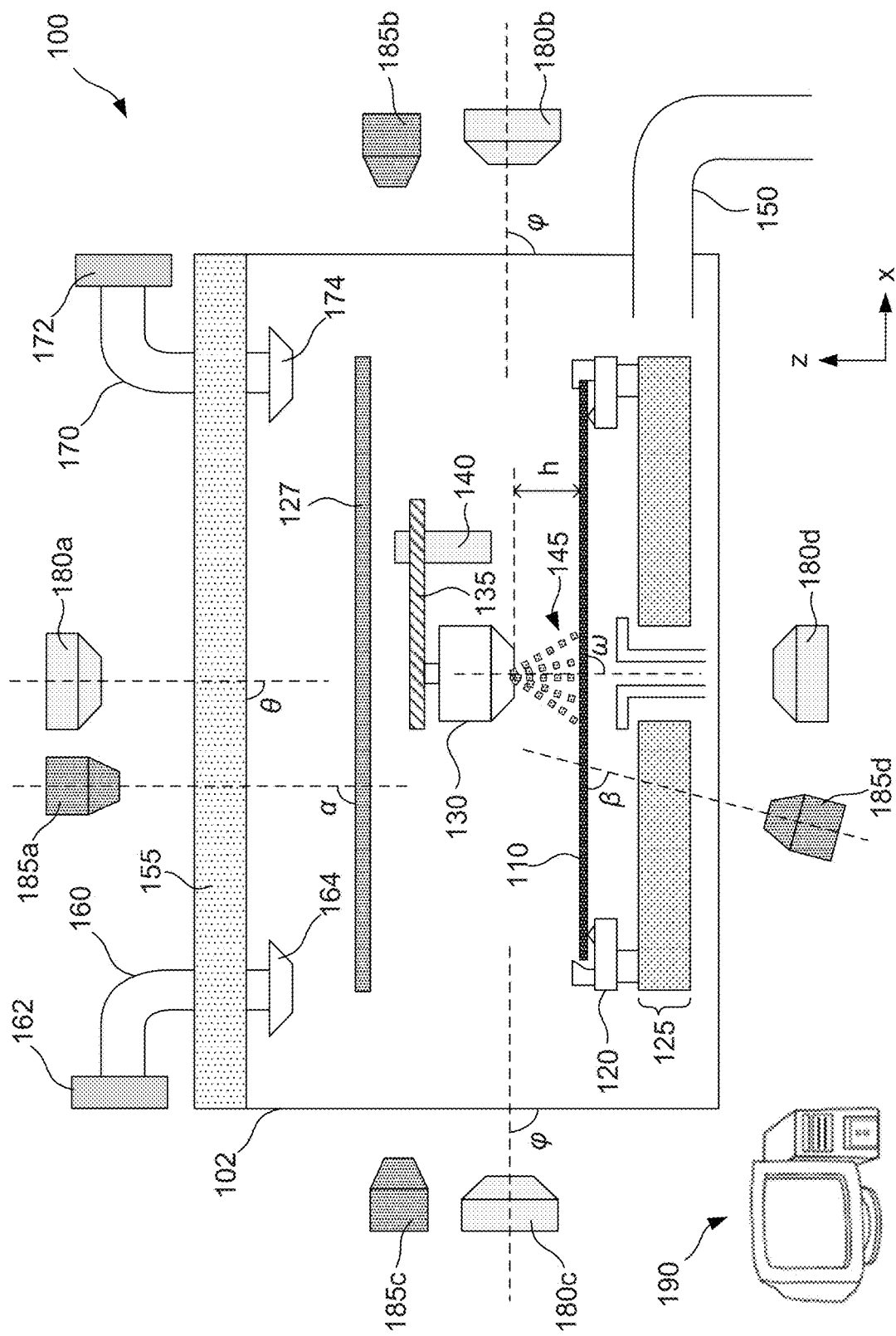
FIG. 1 is a cross-sectional view of an exemplary a single wafer processing station in a wet processing cluster tool, according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed that are between the first and second features, such that the first and second features are not in direct contact.

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "nominal" as used herein refers to a desired, or target, value of a characteristic or parameter for a component or a process operation, set during the design phase of a product or a process, together with a range of values above and/or below the desired value. The range of values is typically due to slight variations in manufacturing processes or tolerances.

The term "substantially" as used herein indicates the value of a given quantity that can vary based on a particular technology node associated with the subject semiconductor device. In some embodiments, based on the particular technology node, the term "substantially" can indicate a value of a given quantity that varies within, for example, ±5% of a target (or intended) value.

The term "about" as used herein indicates the value of a given quantity that can vary based on a particular technology node associated with the subject semiconductor device. In some embodiments, based on the particular technology node, the term "about" can indicate a value of a given quantity that varies within, for example, 5-30% of the value (e.g., ±5%, ±10%, ±20%, or ±30% of the value).

Wet chemical processing is introduced during semiconductor fabrication processing to process wafers using various chemical solutions. Wet chemical processing can be performed in processing chambers of a variety of wet tools, which can handle either batches of wafers at a time (e.g., "multi-wafer" tools) or a single wafer at a time (e.g., "single-wafer" tools). For example, in a single-wafer tool, the wafer enters a processing module and is positioned on a wafer stage. The wafer is then subjected to a wet process via one or more nozzles positioned above the wafer's surface. The one or more nozzles can flow chemicals (e.g., a chemical solution, deionized water, processing gas, etc.) under pressure on the wafer's surface to react with the wafer during an etching process and/or remove contamination during a cleaning process. After these processes, the wafer can be dried (e.g., via spinning) and released from the wet chemical processing tool.

Temperature and chemical flow can vary within a wet chemical processing chamber and cause wafer processing non-uniformity. During chemical processes performed in the wet chemical processing chamber, chemical solutions or vaporized chemicals in a gas form can be more concentrated towards the nozzle and cause chemical concentration to be higher towards the center of the wafer and lower towards the perimeter of the wafer, also known as the "wafer edge map remain defect." Wafer edge map remain defect can also include temperature non-uniformity within the processing chamber. The aforementioned chemical processes can be both time consuming and costly because the chemical flows and temperature levels are not measured concurrently (e.g., in real time) with the wet chemical processing—for example, to determine process quality using the wet process described above requires that the wafer is removed from the wet chemical processing tool after processing, measured on a different tool (e.g., possibly transported to a different location of the fabrication facility), and then returned to the wet chemical processing tool for additional processing, if necessary. This wafer processing analysis can take a substantial amount of time (e.g., one or more hours), thus impacting overall chip production throughput.

The present disclosure describes systems and methods for monitoring a wet chemical processing chamber, which in turn can also be used to fine tune processing steps for wet chemical processing. More particularly, this disclosure is directed to a wafer processing system that collects and analyzes (e.g., in real-time) processing conditions, such as chemical flows and processing temperatures, during wafer processing to determine and monitor a wafer's processing conditions during the fabrication process. If the analyzed data shows that the processing conditions cause wafer processing non-uniformity, the process parameters can be adjusted (e.g., in real time). On the other hand, if the analyzed data shows that the processing conditions are within the predetermined baseline levels, the wafer can be dried and removed from the wet chemical processing tool.

The systems and methods described in the present disclosure can detect and adjust processing temperatures and chemical flows within a processing chamber by 3D visualization of the temperature field and chemical flow using injected suitable illumination markers and detectors that can detect the injected illumination markers. The 3D visualization of processing temperatures and chemical flows can provide at least (i) uniform wafer processing for a loaded wafer in real-time (e.g., during wafer processing); and (ii) parameter adjustments for processing steps such that processing steps can provide uniform processing for subsequent wafers. Illumination devices can be positioned and configured to illuminate the processing chamber and further improve the visibility of the injected chemicals. Detectors (e.g., sensors) can be positioned around the processing chamber and configured to detect the flow rate and/or locations of the injected chemical particles, and a processing system (e.g., computing device) can be used to map the temperature field and flow field of the processing chamber using the information obtained from the chemical flow/location of the chemical particles. Chemicals injected into the processing chamber can be a type of illumination marker that enhances the visibility of chemical particles within the processing chamber. For example, illumination markers can include water vapor droplets, dry ice particles (e.g., solid form of $CO_2$), and any other suitable chemicals. The chemicals injected into the processing chamber can be in vapor form, solid form, liquid form, and/or combinations thereof. The illumination devices can emit light of any suitable color such as, red light, green light, yellow light, orange light, and/or combinations thereof. The detectors can include video cameras, image sensors, infrared detectors, and any other suitable detectors. In some embodiments, the particles can be detected by the human eye. The detected real-time temperature field and chemical flow field can be used to adjust processing steps accordingly and achieve nominal wafer processing conditions.

FIG. 1 is a cross sectional view of an exemplary single-wafer wet chemical processing module or processing station 100 on a wet chemical processing cluster tool (not shown in FIG. 1 for simplicity). Processing station 100 can be a processing chamber of the wet chemical processing cluster tool. The wet chemical processing cluster tool can include additional components required for operation. By way of example and not limitation such components may include modules (e.g., transfer modules and wet chemical processing stations), robotic arms, pumps, exhaust lines, heating elements, gas and chemical delivery lines, controllers, valves, and external and internal electrical connections to other components of the cluster tool (e.g., computer units, chemical analyzers, mass flow controllers, pressure controllers, valves, and pumps). These additional components may or may not be depicted in FIG. 1; however, they are within the spirit and scope of this disclosure.

An exemplary processing station 100 can include processing chamber 102, wafer holder 120, spin base 125, shield 127, spray nozzle 130, nozzle arm 135, spindle 140, drain lines 150, fan filter unit (FFU) 155, distribution lines 160 and 170, and chemical switches 162 and 172. Processing station 100 can further include detectors 180a-180d positioned around processing chamber 102 to detect chemical flow rates and processing temperatures.

A wafer 110 is transferred on a wafer holder 120. Wafer holder 120 is further attached to a spin base 125 of processing station 100. In some embodiments, wafer holder 120 can spin wafer 110 via spin base 125 during a wet chemical process or a drying process at different rotational speeds.

Processing station 100 further includes a spray nozzle 130 attached to a nozzle arm 135, which can pivot around a spindle 140. In some embodiments, processing station 100 can be equipped with multiple spray nozzles 130 depending on the design of processing station 100. In some embodiments, the height h between spray nozzle 130 and wafer 110, the orientation of spray nozzle 130 with respect to a top surface of wafer 110, the lateral scanning speed of spray nozzle 130, the scanning areas of spray nozzle 130, the flow rate of chemical solutions exiting spray nozzle 130, and other suitable parameters of spray nozzle 130 can be adjusted for the duration of the process based on the detected chemical flow real-time 3D visualization and temperature mapping. In some embodiments, spray nozzle 130 may or may not pivot around spindle 140 while a chemical solution 145 is dispensed on wafer 110. Spray nozzle 130 can dispense one or more chemical solutions in the form of a spray to the surface of wafer 110. By way of example and not limitation, spray nozzle 130 can be connected to one or more chemical switch boxes fluidly connected to external tanks filled with chemicals. During a wet chemical process performed in processing chamber 102, spray nozzle 130 can distribute liquid chemical solutions or gaseous chemicals into processing chamber 102.

Chemical switch boxes can be used to dispense suitable chemicals to processing station 100. The chemical switch boxes can be chemical distribution systems, where valves and chemical distribution lines are housed and chemical solutions are pre-mixed prior to delivery to spray nozzle 130 and other distribution nozzles. In some embodiments, chemical solutions can be pre-mixed and chemical switch boxes can be fluidly connected to spray nozzle 130. In some embodiments, distribution lines 160 and 170 can be connected to processing chamber 102 to provide suitable chemicals into processing station 100. For example, suitable chemicals can be provided into processing station 100 through distribution lines 160 and 170. In some embodiments, the suitable chemicals can be illumination markers that enhance the visibility of chemicals and processing gas to detectors 180a-180d. For example, the illumination markers can include water vapor droplets, dry ice particles, any suitable gas, suitable chemical solutions, and/or combinations thereof. In some embodiments, additional distribution lines can be installed at different enclosure surfaces of processing station 100, such as vertical walls and a bottom surface of the chamber enclosure, and are not illustrated for simplicity.

Switches 162 and 172 are respectively installed on distribution lines 160 and 170 to control the delivery of chemicals into processing station 100 based on the detected chemical flow real-time 3D visualization and temperature mapping. For example, distribution line 160 can be used to inject water vapor into processing chamber 102. In such configuration, switches 162 can be used to adjust the flow rate and temperature of the water vapor. In some embodiments, distribution line 170 can be used to inject dry ice into processing chamber 102 by a fan system. In such configuration, switch 172 can be used to adjust the fan speed, which determines the amount of dry ice entering processing chamber 102. In addition, distribution nozzles 164 and 174 can be installed to ends of distribution lines 160 and 170 respectively. In some embodiments, orientations of distribution nozzles 164 and 174 with respect to a surface of wafer 110 can be adjusted based on the detected chemical flow 3D visualization and real-time temperature mapping. In some embodiments, wafer 110 may or may not be rotated while a chemical solution 145 is dispensed on its surface. In some embodiments, chemical solution 145 can be deionized water, hydrogen peroxide, ammonium hydroxide, any suitable chemical solution, and/or combinations thereof. In some embodiments, distribution nozzles 164 can also dispense processing gas, such as ozone. Processing station 100 can also include a fan filter unit (FFU) providing filtered air for the interior of processing station 100. For example, an FFU 155 can be connected to a top surface of processing chamber 102 and can have more than one filter and more than one blower motor depending on a nominal air flow.

Drain lines 150 can be attached to processing chamber 102 to collect chemical solutions. According to some embodiments, the chemical solution can be collected through the one or more drain lines 150 to a collection tank after it has been disposed from the wafer's surface. In some embodiments, collection of the consumed chemical solution can be performed while wafer 110 spins during the wet chemical processing.

One or more detectors 180a-180d can be positioned around processing chamber 102. In some embodiments, detectors 180a-180d are positioned around sidewalls and top/bottom walls of processing chamber 102. For example, four detectors can be positioned around a rectangular-shaped processing chamber 102, with each detector facing a sidewall of processing chamber 102. In some embodiments, one or more detectors can be positioned toward each sidewall of processing chamber 102. In some embodiments, viewports can be installed on sidewalls and top/bottom walls of processing chamber 102 and aligned with respective detectors such that the interior of processing chamber 102 is visible to the respective detectors. In some embodiments, detectors 180a-180d can be video cameras, image sensors, infrared detectors, and/or any other suitable detectors. In some embodiments, detectors 180a-180d can store images of the inspected chamber area for future use and analysis. In some embodiments, selected detectors of detectors 180a-180d can be positioned at an angle with reference to surfaces of processing chamber 102 to improve imaging of the inspection area. For example, detector 180a can be positioned over processing chamber 102 and positioned at an angle θ with reference to top surface of processing chamber 102 that is substantially in parallel with wafer 110. In some embodiments, angle θ can be in a range between about 60° and about 120°. In some embodiments, angle θ can be about 90°. In some embodiments, angle θ can be less than or greater than about 90°. Similarly, detectors 180b-180c can be positioned towards sidewalls of processing chamber 102 and at an angle φ with reference to the chamber sidewall. In some embodiments, angle φ can be in a range between about 60° and about 120°. In some embodiments, the angles can be different among detectors 180a-180d. Detectors 180a, 180b, and 180c are coordinated to determine various working conditions of the process performed in processing chamber 102, such as work tracking, start/stop position determination, detection of abnormal vibration of moving parts, and any other suitable working conditions.

In some embodiments, detectors 180a-180d can each be a charge-coupled device (CCD) camera that is a component of a CCD-based image detection system. In some embodiments, photocells, or other such automated detecting apparatus which generates or creates an image of an area presented thereto can also be used. In some embodiments, detectors 180a-180d can include at least one CCD monochrome or color camera, depending on the process being inspected. CCD cameras can provide the benefit of generating electrical signals that are readily transferred and processed by processing system 190. Therefore, detectors 180a-180d can each be configured to produce one or more high resolution images of the process liquid or gas particles contained in processing chamber 102 and supply the high resolution images to processing system 190. In some embodiments, where the process liquid or gas particles are not opaque, the images produced by detectors 180a-180d can also include contents of processing chamber 102 (e.g., wafer 110, spray nozzle 130, etc.).

In some embodiments, detectors 180a-180d can be infrared radiation (IR) detectors (e.g., infrared cameras) positioned above or adjacent to processing chamber 102. The amount of thermal IR emitted from an object is in direct proportion to the temperature of the object, and detectors 180a-180d can be configured to detect and produce thermal IR images based on a temperature profile in processing chamber 102. For wafer processing uniformity, components within processing chamber 102 are preferred to be at the same temperature, which results in a uniform temperature profile. Any temperature abnormalities in the wet processing chamber (e.g., non-uniform temperature gradient) can be detected by observing the temperature differences between wafer 110, the process fluid, and the wafer lifter, and/or comparing the thermal IR images obtained by detectors 180a-180d to one or more baseline IR images. The infrared energy can be detected by detectors 180a-180d in real time (e.g., during wafer processing), and signals representative of the infrared image can be directed to a processing system 190. In some embodiments, processing system 190 is similar to the CCD-based image detection system described above. Sensor electronics and signal processing circuitry within detectors 180a-180d can convert the data into images that can be viewed by processing system 190 or on a video monitor. In some embodiments, the IR-based process system can be used as a separate system, or in combination with the CCD-based image detection system described above.

Illumination devices 185a-185d can be positioned around processing chamber 102 to illuminate the interior of processing chamber 102 and enhance the visibility of particles or liquid within a target inspection area. Illumination devices 185a-185d can be provided to ensure a nominal amount of light is available in the target inspection area. For example, the target inspection area can be an area between wafer 110 and shield 127 of processing chamber 102, where chemicals are dispensed onto wafer 110 for processing or cleaning. In some embodiments, illumination devices 185a-185d can be a lighting system, which alters lighting conditions so that chemical flows in the target inspection area can be adequately detected by detectors 180a-180d. The type and design of the illumination devices 185a-185d can depend on the type of chemicals used for processing or cleaning in processing chamber 102 and/or particles injected by distribution nozzles 164 and 174. For example, illumination devices 185a-185d can be helium-neon (He—Ne) laser device, which can provide laser having various wavelengths. In some embodiments, light having greater wavelength is more efficient at illuminating larger particles (e.g., particles having larger diameters). In some embodiments, illumination devices 185a-185d are configured to emit red light with a wavelength between about 620 nm and about 640 nm. For example, red light with a wavelength of about 633 nm can be projected into the target inspection area through viewports. In some embodiments, illumination devices 185a-185d are configured to provide orange light with a wavelength between about 605 nm and about 620 nm. For example, orange light with a wavelength of about 612 nm can be projected into the target inspection area through viewports. In some embodiments, illumination devices 185a-185d are configured to provide yellow light with a wavelength between about 585 nm and about 605 nm. For example, yellow light with a wavelength of about 594 nm can be projected into the target inspection area through viewports. In some embodiments, illumination devices 185a-185d are configured to provide green light with a wavelength between about 500 nm and about 585 nm. For example, green light with a wavelength of about 543 nm can be projected into the target inspection area through viewports. In some embodiments, illumination devices 185a-185d can create a diffuse, uniform illumination of the target inspection area so that a high quality image of the inspection area can be detected by detectors 180a-180d and analyzed by processing system 190. In some embodiments, the illumination devices can be flood lighting that provides uniform light reflection on the chemical particles in the target inspection area, which eliminates glare, shading, and image distortion. In some embodiments, illumination devices 185a-185d can include light-emitting diodes (LEDs). In some embodiments, illumination devices 185a-185d can be positioned in a similar fashion and share the same viewports as detectors 180a-180d such that no additional viewports is needed. In some embodiments, one or more of illumination devices 185a-185d can be positioned at an angle with reference to wafer surface of wafer 110 located within processing chamber 102 to better illuminate chemical flow within the target inspection area. For example, illumination device 185a can be positioned over processing chamber 102 and positioned at an angle α with reference to shield 127 that is substantially in parallel with wafer 110. In some embodiments, angle α can be in a range between about 60° and about 120°. Similarly, illumination device 185d can be positioned under processing chamber 102 and positioned at an angle β with reference to wafer 110. In some embodiments, angle β can be in a range between about 60° and about 120°. For example, angle β can be about 90°. In some embodiments, angles α and β can coordinate among each other such that detectors can be configured to obtain data used for determining surface conditions of the moving parts within processing chamber 102. For example, detectors 180a-180d can be configured to obtain data for determining wafer vibration during processing. If the vibration increases, it could indicate that the wafer chuck is aging or damaged and should be replaced.

A processing system 190 can be electrically connected to detectors 180a-180d. Processing system 190 can house image processing circuitry and software for converting signals generated by detectors 180a-180d into images suitable for viewing by a user. The resulting images can be displayed on processing system 190 or a viewing device such as a computer monitor located at, for example, an operator work station. Based on the images, a determination can be made by processing system 190 whether the processing chamber conditions are unacceptable. An example of an unacceptable, or non-conforming, processing chamber condition can be non-uniform chemical solution distribution on wafer 110 or non-uniform gas particle distribution on wafer 110. Both conditions can be determined based on process chamber images and process chamber contents. The detectors can be operated to take "still" shots (e.g., upon receiving a command from an operator) or can be operated to continuously capture images at predetermined intervals during wafer processing.

In some embodiments, processing system 190 can be used to receive from detectors 180a-180d digitized images of a target inspection portion of process chamber 102 or a portion of the contents of the process tank. Processing system 190 can receive one or more images and use the received images to perform various analytical tasks, such as (i) real-time visualization of processing conditions of the processing chamber; and (ii) comparing the received images with a previously-stored image representing a uniform processing condition in the processing chamber.

In some embodiments, processing system 190 can receive multiple images produced by detectors 180a-180d taken in predetermined intervals during wafer processing. Each detector of detectors 180a-180d can take images at the same time and/or at time intervals to form sets of images. The sets of images are received and analyzed by processing system 190 to determine the chemical flow or gas flow of processing chamber 102.

In some embodiments, processing system 190 can receive images detected by detectors 180a-180d and compare the received images with stored images to determine a processing condition of processing chamber 102. For example, an image of uniform processing condition of processing chamber 102 can be used as a "setpoint pattern" and stored in a memory device in processing system 190 to be compared with received images from detectors 180a-180d. In some embodiments, detectors 180a-180d can capture images of the target inspection area of processing chamber 102 and transmit the captured images to processing system 190. The images can be digitized by processing system 190 and compared to the stored setpoint patterns. Any substantial disparity between the images can represent a non-uniform processing condition in the processing chamber, such as non-uniform chemical flow and/or gas flow within processing chamber 102.

Processing system 190 can be configured to perform a variety of additional or alternative analytical tasks, such as analysis of any suitable electrical signals, statistics processing, task scheduling, generation of alarm signals, generation of further control signals, and the like. For example, upon detection of processing abnormality, processing system 190 can be configured to generate alarm signals to alert a user and can be further configured to perform a series of scheduled tasks within the processing chamber in order to reduce the detected processing condition abnormality. Processing system 190 can be placed adjacent processing chamber 102 so that, for example, an operator can easily access both processing system 190 and processing chamber 102 to determine the non-uniform processing condition and to attend to and to correct the cause of the condition. Alternatively, in some embodiments, processing system 190 can be placed at a remote location, such as a process command center where a variety of images from a variety of processing stations or wet benches can be monitored together.

Figure 2:
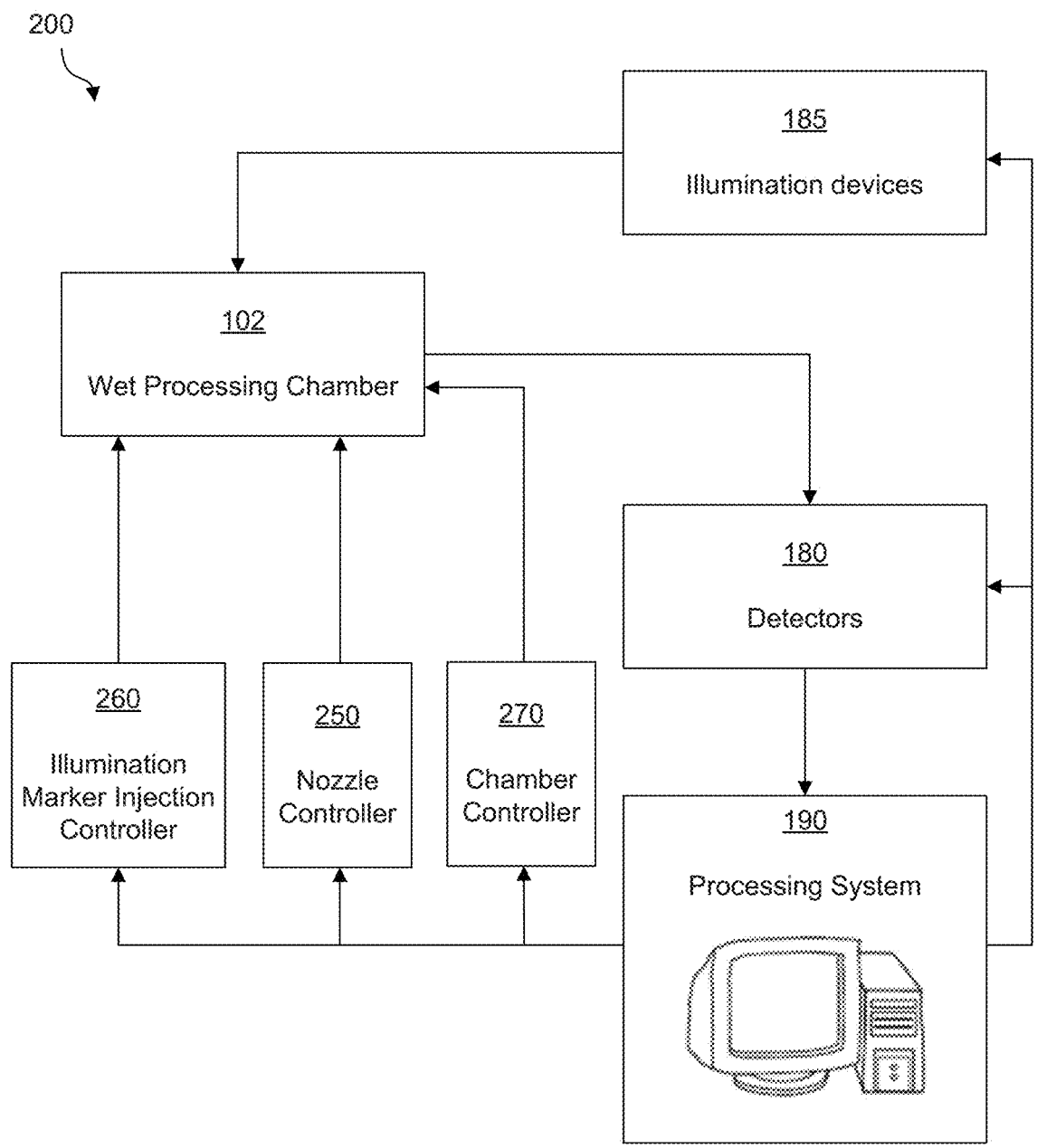
FIG. 2 is an exemplary wet processing system, according to some embodiments.

FIG. 2 is an exemplary wet processing system, according to some embodiments. Exemplary wet processing system 200 illustrated in FIG. 2 can include wet processing chamber 102, detectors 180, illumination devices 185, processing system 190, nozzle controller 250, illumination marker injection controller 260, and chamber controller 270. Wet processing system 200 can further include other suitable components, such as additional detectors, sensors, pumps, valves, which are not illustrated in FIG. 2 for simplicity. In some embodiments, nozzle controller 250, illumination marker injection controller 260, and chamber controller 270 can include any suitable computer controlled modules such as valves, motors, or wafer stages. In some embodiments, the abovementioned controllers can control a variety of device parameters based on the detected chemical flow 3D visualization and real-time temperature mapping. For example, with reference to FIGS. 1 and 2, nozzle controller 250 can control a height h between spray nozzle 130 and wafer 110, the orientation of spray nozzle 130 with respect to a top surface of wafer 110, the lateral scanning speed of spray nozzle 130, the scanning areas of spray nozzle 130, the flow rate of chemical solutions exiting spray nozzle 130, the lateral scanning speed of spray nozzle 130, the scanning areas of spray nozzle 130, and other suitable parameters of spray nozzle 130. In some embodiments, spray nozzle 130 can be controlled by nozzle controller 250 to dispense one or more chemical solutions. In some embodiments, illumination marker injection controller 260 can be operated to open or close chemical switch 162 to start or stop water vapor flow into processing chamber 102. In some embodiments, chamber controller 270 can be operated to adjust fan speed of FFU 155, rotational speed of spin base 125 which in turn determines rotational speed of wafer 110, movement of wafer holder 120, and any other suitable parameters. Suitable processing parameters can be adjusted based on the 3D mapping result of the chamber condition. For example, if the 3D processing temperature mapping indicates that the highest processing temperature is located off-center of processing chamber 102 or if there is an undesirable high temperature region in processing chamber 102, the lateral scanning speed and start/stop position of spray nozzle 130 can be adjusted to compensate for the temperature non-uniformity and ensure that wafer processing is uniform.

Figure 3:
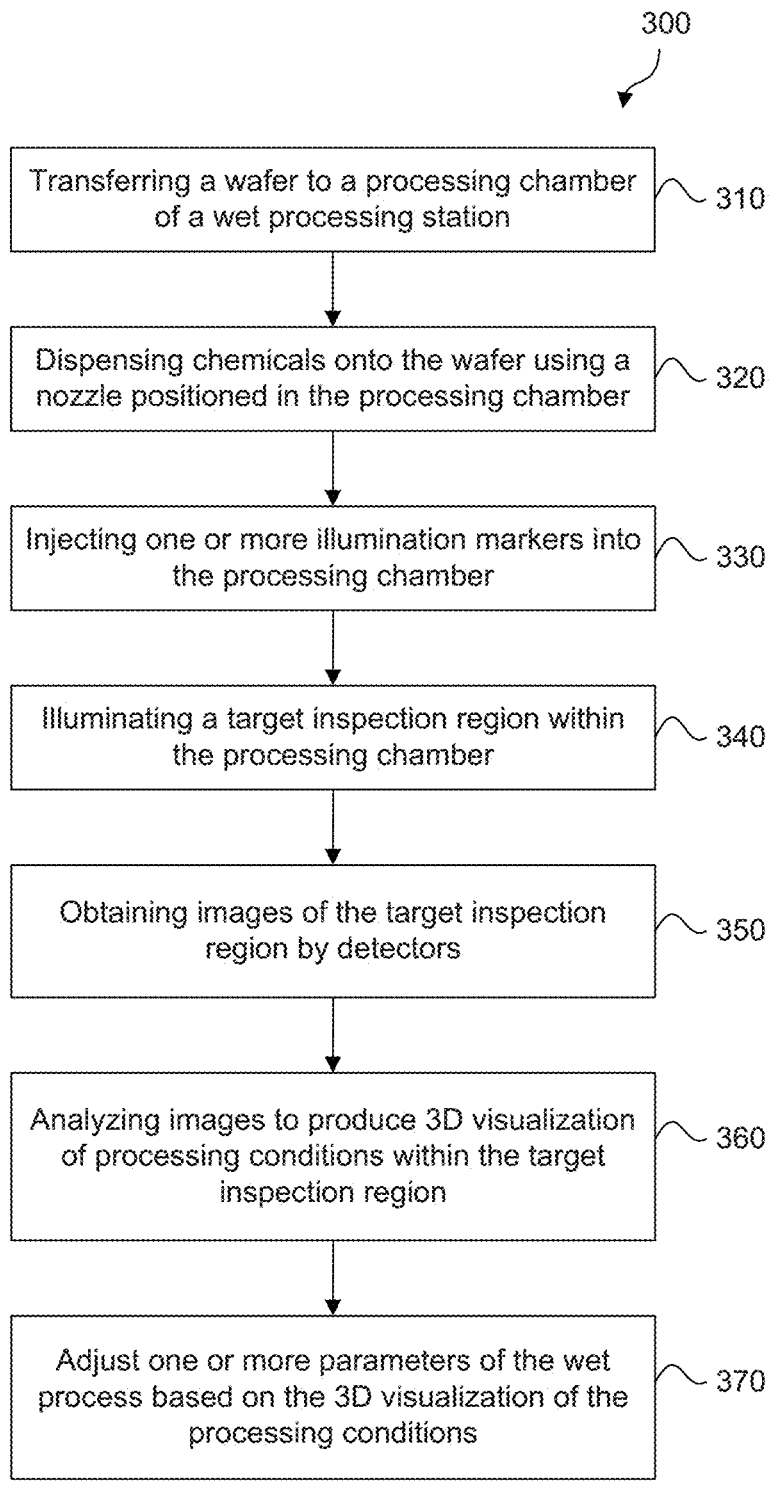
FIG. 3 is a flow chart of performing an exemplary wet process for a wafer processing station, according to some embodiments.

FIG. 3 is a flow chart of method 300, which describes an exemplary 3D visualization process of chemical flows and gas flow of monitoring procedure for wet chemical processing station, according to some embodiments. By way of example and not limitation, the wet chemical processing of method 300 can be performed in processing station 100 and wet processing system 200 shown in FIGS. 1 and 2 respectively. This disclosure is not limited to this operational description. Rather, other operations are within the spirit and scope of the present disclosure. It is to be appreciated that additional operations may be performed. Moreover, not all operations may be needed to perform the disclosure provided herein. Further, some of the operations may be performed simultaneously, or in a different order than shown in FIG. 3. In some implementations, one or more other operations may be performed in addition to or in place of the presently described operations. For illustrative purposes, method 300 is described with reference to the embodiments of FIGS. 1, 2, and 4A-4C. However, method 300 is not limited to these embodiments.

For example purposes, method 300 will be described for a single-wafer wet chemical processing station. Based on the disclosure herein, method 300 can be equally applied to batch wet chemical processing stations that can process multiple wafers at a time. Both wet chemical processing station configurations (single-wafer and batch) are within the spirit and scope of this disclosure.

Method 300 begins with operation 310, where a wafer is transferred to a wet chemical processing station. For example, wafer 110 can be transferred to wet chemical processing chamber 102 via a transfer module with a robotic arm (not shown). As discussed above, wet chemical processing chamber 102 can be a module in a wet processing cluster tool (e.g., wet chemical processing station 100), which can further include additional wet chemical processing stations, modules, and equipment appropriate for its operation.

In operation 320 of method 300, wafer 110 is exposed to a wet chemical process inside wet chemical processing station 100 and react to the disposed chemical solutions or processing gas provided by a nozzle positioned within processing chamber 102. The wet chemical process can include one or more chemical solutions, in liquid or gas forms, according to some embodiments. As discussed above with respect to FIG. 1, chemical solutions can be disposed on the surface of wafer 110 through a spray nozzle 130 such that materials and structures on wafer 110 can be exposed to and react to the dispensed chemical solutions. In some embodiments, more than one spray nozzle 130 can be installed in processing chamber 102 to dispense a variety of chemical solutions, and the nozzles can be individually or collectively controlled by nozzle controller 250 as illustrated in FIG. 2. For example, for the duration of the wet chemical process, nozzle controller 250 can control a variety of nozzle parameters based on the detected chemical flow 3D visualization and real-time temperature mapping. For example, with reference to FIG. 2, nozzle controller 250 can control the height h between spray nozzle 130 and wafer 110, the orientation of spray nozzle 130 with respect to a top surface of wafer 110, the lateral scanning speed of spray nozzle 130, the scanning areas of spray nozzle 130, the flow rate of chemical solutions exiting spray nozzle 130, the lateral scanning speed of spray nozzle 130, the scanning areas of spray nozzle 130, and other suitable parameters of spray nozzle 130. In some embodiments, the wet chemical process can be a multi-step chemical process that subjects the wafer to a series of chemical solutions. Spray nozzle 130 can be controlled by nozzle controller 250 to dispense one or more chemical solutions, such as, hydrogen peroxide, ammonium hydroxide, hydrochloric acid, sulfuric acid, deionized water, and any other suitable chemical solutions. Spray nozzle 130 can be connected via one or more chemical switch boxes (not shown) to external tanks (not shown) filled with pre-mixed or unmixed chemicals (e.g., hydrochloric acid, hydrogen peroxide, ammonium hydroxide, sulfuric acid, and/or deionized water).

In operation 330 of method 300 of FIG. 3, one or more illumination markers are injected into the wet chemical processing chamber, according to some embodiments. Illumination markers can be chemical particles used to enhance the visibility of the chemical flow within the target inspection area such that the processing chemical flow or processing gas flow can be visible to the naked eye of a user or to the detectors positioned around the wet chemical processing chamber such that the chemical flow or gas flow can be visible on a digital image. In some embodiments, chemical boxes can inject water vapor into the wet chemical processing chamber. Referring to FIG. 1, the water vapor can be dispensed into processing chamber 102 by distribution line 160. In such configuration, switches 162 can be used to adjust the flow rate of the water vapor. In some embodiments, water vapor can be provided by heating up a water reservoir using a heating apparatus, such as a hot plate. A semipermeable membrane can be positioned above the water reservoir to allow passage of water vapor and filter unwanted particles. In referring to FIGS. 1 and 2, processing system 190 can be configured to operate illumination marker injection controller 260 and adjust water vapor input for processing chamber 102. For example, illumination marker injection controller 260 can be operated to open or close chemical switch 162 to start or stop water vapor flow into processing chamber 102. In some embodiments, processing system 190 can also determine the temperature of heating apparatus which in turn determines the temperature of water vapor exiting nozzle 164. For example, the temperature of the heating apparatus can be controlled to be between about 0° C. and about 110° C. Specifically, the heating apparatus can provide suitable processing temperatures for a specific process. For example, the heating apparatus can provide processing temperature, such as room temperature, about 40° C., about 60° C., about 110° C., and any other suitable temperature. In some embodiments, chemical boxes can inject dry ice into the wet chemical processing chamber. Referring to FIG. 1, the dry ice can be dispensed into processing chamber 102 by distribution line 170. In such configuration, switches 172 can be used to adjust the flow rate the dry ice. In some embodiments, dry ice can be provided by connecting a high-pressure $CO_2$ gas cylinder and decompressing the $CO_2$ to about 1 atm. A pump having a fan unit can be used to provide dry ice to processing chamber 102. In referring to FIGS. 1 and 2, processing system 190 can be configured to operate illumination marker injection controller 260 and adjust the amount of dry ice dispensed into processing chamber 102. For example, illumination marker injection controller 260 can be operated to open or close chemical switch 172 to start or stop dry ice flow into processing chamber 102. In some embodiments, processing system 190 can also determine dry ice flow by adjusting the fan speed of the fan unit. For example, the fan speed can be controlled to be between about 0 rpm and 2000 rpm. A greater fan speed would flow more dry ice into processing chamber 102 and cool down the chamber at a greater rate.

In operation 340 of method 300 of FIG. 3, a target inspection region within the processing chamber is illuminated, according to some embodiments. Illumination devices such as illumination devices 185a-185d can be positioned around processing chamber 102 to illuminate the interior of processing chamber 102 and enhance visibility of particles or liquid within the inspection area. Illumination devices 185a-185d can be provided to ensure a nominal amount of light is available in the inspection area. In referring to FIGS. 1 and 2, processing system 190 can be configured to control illumination devices 185 to provide nominal illumination. In some embodiments, illumination devices can be configured to provide different light wavelengths suitable for illuminating illumination markers within the processing chamber. In some embodiments, processing system 190 can be configured to adjust the placement angles of illumination devices 185 with reference to processing chamber 102. Examples of angles of illumination devices 185 can be angles α or β described above in FIG. 1.

In operation 350 of method 300 of FIG. 3, one or more images of the target inspection region are obtained by detectors, according to some embodiments. In some embodiments, detectors such as detectors 180a-180d described above in FIG. 1 can be controlled by processing system 190 to take images of the target inspection region of wet processing chamber 102 in predetermined intervals during wafer processing. Each detector of detectors 180a-180d is positioned towards the target inspection region and coordinated by processing system 190 to images at the time and at the same time intervals to form sets of images. For example, a first set of images S1 produced by detectors 180a-180d are obtained at time point $t_1$, a second set of images S2 produced by detectors 180a-180d are obtained at time point $t_2$, and so on. Each set of image contains views taken from at least three axial directions (e.g., x, y, and z directions). In some embodiments, images can be taken from more than three axial directions, such as x, y, z, −x, −y, and −z directions. In some embodiments, detectors can be positioned at various angles with reference to the axial directions described above. In some embodiments, more than one detector can be positioned at each direction, thus more than one image can be taken for a direction at the same time point. The sets of images are received and analyzed by processing system 190 to determine the chemical flow or gas flow of processing chamber 102. In some embodiments, detectors 180a-180d can be infrared detectors configured to obtain temperature measurements of internal surfaces of various components processing chamber 102.

Figure 4A:
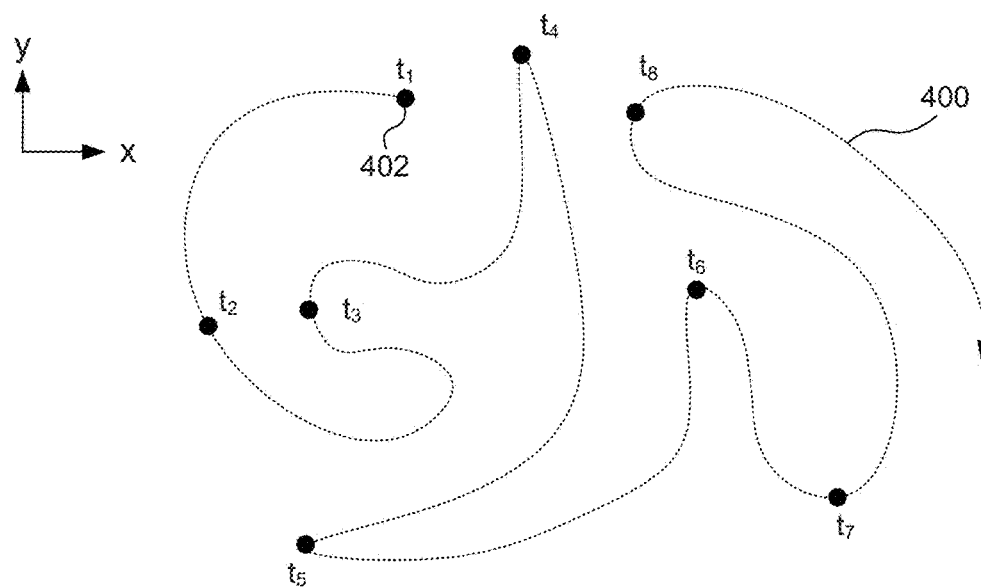
FIGS. 4A-4C are exemplary trajectories of an illumination marker, according to some embodiments.
Figure 4B:
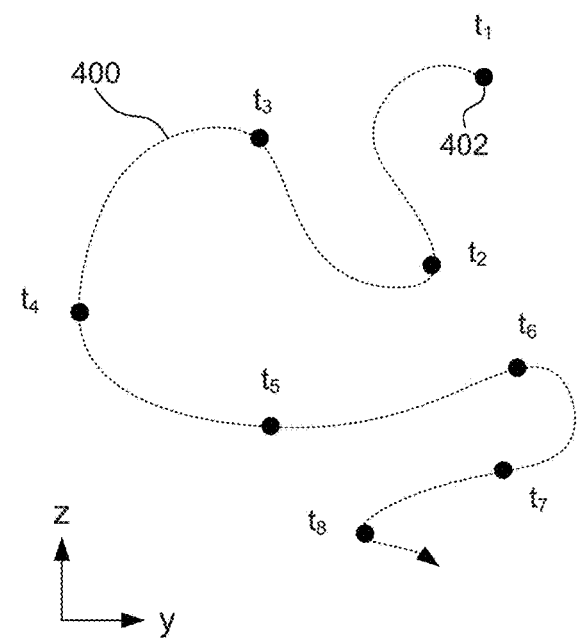
Figure 4C:
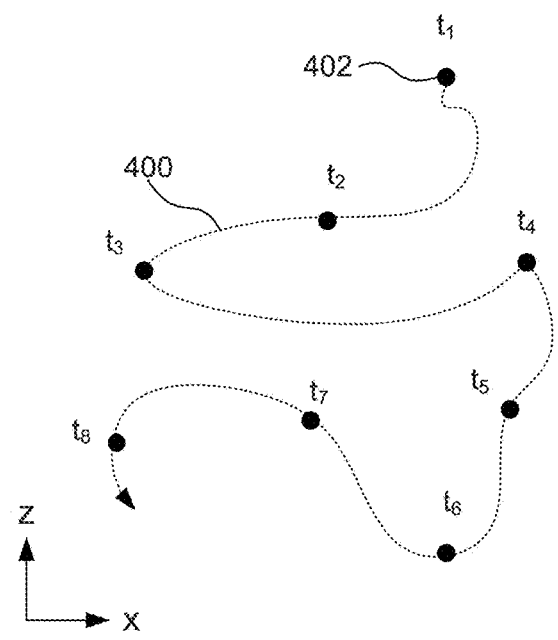

In operation 360 of method 300 of FIG. 3, the obtained images are analyzed to produce 3D visualization of processing conditions within the target inspection region, according to some embodiments. Processing system 190 can be configured to distinguish the positions of illumination markers based on the received sets of images. In some embodiments, illumination markers can be water vapor droplets, dry ice particles, or any suitable chemical particles. As the movements of illumination markers are substantially the same as the chemical and gas flow within processing chamber 102, processing system 190 can further be configured to create a 3D mapping of the chemical and gas flow within the target inspection area of processing chamber 102. In some embodiments, processing system 190 can be configured to create a 3D mapping of the temperature gradient of various internal surfaces of processing chamber 102. For example, processing system 190 can use machine vision or image processing algorithms to identify and track movements of illumination markers within the inspection region of processing chamber 102. For example, processing system 190 can apply an automated optical inspection (AOI) algorithm on multiple images. Processing system 190 can further record and analyze the positions of illumination markers and produce a 3D mapping of the chemical and gas flow. For example, with reference to FIGS. 4A-4C, processing system 190 receives multiple image sets respectively taken at sequential time points $t_1$-$t_8$ separated by an equal time interval. In some embodiments, the time interval can be any suitable time intervals such as, 0.01 s, 0.1 s, 0.5 s, 1 s, and any other suitable time intervals. In some embodiments, the time intervals taken between each image can be different. For simplicity purposes, time points $t_1$-$t_8$ are set with the same time interval of about 0.025 s. Processing system 190 can be configured to analyze the received image sets and produce 3D mapping of the locations and movements of illumination particles. FIGS. 4A-4C are exemplary illustrations of the analyzed movements of detected illumination particle 402 within the inspection region of processing chamber 102. FIGS. 4A-4C are respective views from the z, x, and −y axes that illustrate the movement of illumination particle 402 along trajectory 400.

In operation 370 of method 300 of FIG. 3, the processing system can adjust one or more parameters of the wet process based on the 3D visualization (from operation 360) to provide uniform processing of a wafer loaded into the wet processing chamber, according to some embodiments. For example, based on generated 3D visualization such as the 3D visualization generated with reference to FIGS. 4A-4C, processing system 190 can adjust one or more parameters of processing station 100. For example, with reference to FIGS. 1 and 2, processing station 190 can be configured to control nozzle controller 250 based on the 3D visualization to provide a uniform processing condition within processing chamber 102. In some embodiments, processing station 190 can be configured to determine if trajectory 400 of illumination particle 402 is within a predetermined trajectory range. In response to trajectory 400 of illumination particle 402 being within the predetermined trajectory range, processing system 190 can be configured to determine that the processing condition in processing chamber 102 is substantially uniform and allow processing to continue by maintaining the same process parameters. In response to trajectory 400 of illumination particle 402 being outside the predetermined trajectory range, processing system 190 can be configured to adjust one or more parameters of processing station 100 such that uniform processing condition can be achieved. In some embodiments, processing system 190 can control nozzle controller 250 to adjust one or more parameter of spray nozzle 130 illustrated in FIG. 1. For example, nozzle controller 250 can control the height h between spray nozzle 130 and wafer 110, the orientation of spray nozzle 130 with respect to a top surface of wafer 110, the flow rate and/or temperature of chemical solutions exiting spray nozzle 130, the lateral scanning speed of spray nozzle 130, the scanning areas of spray nozzle 130, scanning speed and area of spray nozzle 130, and/or other suitable parameters of spray nozzle 130. In some embodiments, an angle ω between spray nozzle 130 with respect to a top surface of wafer 110 can be adjusted. In some embodiments, processing system 190 can control chamber controller 270 to adjust one or more parameters of processing chamber 102. For example, one or more parameter can include fan speed of FFU 155, rotational speed of spin base 125 which in turn determines rotational speed of wafer 110, movement of wafer holder 120, and any other suitable parameters.

In some embodiments, processing system 190 can be configured to construct a 3D visualization of the temperature gradient within processing chamber 102. For example, detectors 180a-180d can be infrared detectors that can obtain temperature measurements for various surfaces within processing chamber 102, such as different areas of the wafer surface. In some embodiments, chemical reactions generate heat on the wafer surface, and temperature measurements can detect whether an area on the wafer exceeds a predetermined temperature threshold; if so, an alert of the abnormal processing condition (e.g., to a user) can be issued. In some embodiments, the chemical reaction starts from a center of the wafer, and the temperature profiling could be configured to begin at the center of the wafer. In response to a temperature gradient within than a predetermined threshold, processing system 190 can be configured to maintain the temperature gradient within processing chamber 102 to continue processing under uniform processing condition. In response to a temperature gradient greater than a predetermined threshold, processing system 190 can be configured to adjust one or more parameters of processing station 100 such that uniform temperature condition can be achieved. In some embodiments, processing system 190 can control nozzle controller 250 to adjust one or more parameter of spray nozzle 130 illustrated in FIG. 1. For example, nozzle controller 250 can control the height h between spray nozzle 130 and wafer 110, the orientation of spray nozzle 130 with respect to a top surface of wafer 110, the lateral scanning speed of spray nozzle 130, the scanning areas of spray nozzle 130, the flow rate and/or temperature of chemical solutions exiting spray nozzle 130, the lateral scanning speed of spray nozzle 130, the scanning areas of spray nozzle 130, scanning speed and area of spray nozzle 130, and/or other suitable parameters of spray nozzle 130. In some embodiments, an angle ω between spray nozzle 130 with respect to a top surface of wafer 110 can be adjusted. In some embodiments, processing system 190 can control chamber controller 270 to adjust one or more parameters of processing chamber 102. For example, one or more parameter can include fan speed of FFU 155, rotational speed of spin base 125 which in turn determines rotational speed of wafer 110, movement of wafer holder 120, and any other suitable parameter.

The exemplary wet chamber processing method described in method 300 is not limited to single-wafer processing stations (e.g., processing station 100). For example, the exemplary method 300 can be applied to wet processing stations that can treat batches of wafers as opposed to one wafer at a time. In such configuration, multiple spray nozzles and wafer holders can be used to simultaneously process multiple wafers.

This disclosure is directed to a detecting and adjusting processing temperatures and chemical flows within a processing chamber by 3D visualizing a temperature field and chemical flow using injected suitable chemicals and detectors to detect the injected chemicals. The 3D visualization of processing temperatures and chemical flows can provide at least (i) uniform wafer processing for a loaded wafer in real-time (e.g., during wafer processing); and (ii) parameter adjustments for processing steps to achieve uniform processing for subsequent wafers. Illumination devices can be positioned and configured to illuminate the processing chamber and further improve the visibility of the injected chemicals. Detectors (e.g., sensors) can be positioned around the processing chamber and configured to detect the flow rate and/or locations of the injected chemical particles, and an analyzer (e.g., computer processor) can be used to map the temperature field and flow field of the processing chamber using the information obtained from the chemical flow/location of the chemical particles. Chemicals injected into the processing chamber can be a type of illumination marker that enhances the visibility of chemical particles within the processing chamber. For example, illumination markers can include water vapor droplets, dry ice particles, and any other suitable chemicals. The detected real-time temperature field and gas flow field can be used to adjust processing steps accordingly and achieve nominal wafer processing conditions.

In some embodiments, a method for controlling a wet processing system includes dispensing one or more chemicals into a processing chamber according to one or more process parameters. The method also includes injecting one or more illumination markers into the processing chamber and obtaining images representing locations of the one or more illumination markers. The method further includes determining a trajectory of an illumination marker of the one or more illumination markers based on the images and determining whether the determined trajectory is outside a predetermined trajectory range. In response to the determined trajectory being outside the predetermined trajectory range, the method further includes adjusting the one or more process parameters.

In some embodiments, a method for controlling a wet processing system includes dispensing, with a spray nozzle, a chemical solution into a processing chamber and injecting one or more illumination markers into the processing chamber. The method also includes illuminating, with an illumination device, the processing chamber. The method further includes obtaining a plurality of sets of images representing locations of the one or more illumination markers, wherein each set of the plurality of sets of images is obtained at a same time point. The method further includes determining a trajectory of an illumination marker of the one or more illumination markers based on the plurality of sets of images and determining whether the determined trajectory is within a predetermined trajectory range. In response to the determined trajectory being within the predetermined trajectory range, the method maintains one or more process parameters of the wet processing system. In response to the determined trajectory being outside the predetermined trajectory range, the method includes adjusting the one or more process parameters of the wet processing system.

In some embodiments, a wet processing system includes a processing chamber and a spray nozzle positioned within the processing chamber and configured to dispense a chemical solution over one or more wafers. The wet processing system also includes one or more chemical distribution lines configured to inject one or more illumination markers into the processing chamber and one or more detectors positioned around the processing chamber and configured to obtain images representing locations of the one or more illumination markers. The wet processing system further includes a processing system configured to determine a trajectory of an illumination marker of the one or more illumination markers based on the images and determine whether the determined trajectory is outside a predetermined trajectory range. The wet processing system also configured to adjust one or more process parameters associated with the wet processing system in response to the determined trajectory being outside the predetermined trajectory range.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A method for controlling a wet processing system, comprising:
    dispensing, by a spray nozzle, one or more wet chemical solutions into a target inspection area of a processing chamber according to one or more process parameters, wherein the one or more process parameters comprise at least one of an angle of the spray nozzle, a height of the spray nozzle, and a lateral scanning speed of the spray nozzle;
    injecting one or more illumination markers into the processing chamber;
    obtaining images representing locations of the one or more illumination markers;
    determining a trajectory of an illumination marker of the one or more illumination markers based on the images;
    determining whether the determined trajectory is outside a predetermined trajectory range; and
    in response to the determined trajectory being outside the predetermined trajectory range, adjusting the one or more process parameters.

2. The method of claim 1, wherein the one or more process parameters comprise at least one of a flow rate and a temperature of the one or more chemicals.

3. The method of claim 1, wherein the one or more process parameters comprise a fan speed of a fan filter unit positioned over the processing chamber.

4. The method of claim 1, wherein the injecting the one or more illumination markers comprises injecting water vapor through a chemical distribution line.

5. The method of claim 1, wherein the injecting the one or more illumination markers comprises injecting dry ice through a chemical distribution line.

6. The method of claim 1, further comprising illuminating the processing chamber with a helium-neon laser device.

7. The method of claim 1, wherein obtaining the images comprises obtaining a plurality of sets of images, and wherein the images in each set of the plurality of sets of images are obtained at a same time.

8. A method for controlling a wet processing system, comprising:
    dispensing, with a spray nozzle, a chemical solution into a processing chamber;
    injecting one or more illumination markers into the processing chamber;
    illuminating, with an illumination device, the processing chamber;
    obtaining a plurality of sets of images representing locations of the one or more illumination markers, wherein each set of the plurality of sets of images is obtained at a same time point;
    determining a trajectory of an illumination marker of the one or more illumination markers based on the plurality of sets of images;
    determining whether the determined trajectory is within a predetermined trajectory range;
    in response to the determined trajectory being within the predetermined trajectory range, maintaining one or more process parameters of the wet processing system, wherein the one or more process parameters comprise at least one of an angle of the spray nozzle, a height of the spray nozzle, and a lateral scanning speed of the spray nozzle; and
    in response to the determined trajectory being outside the predetermined trajectory range, adjusting the one or more process parameters of the wet processing system.

9. The method of claim 8, wherein the injecting the one or more illumination markers comprises injecting water vapor through a chemical distribution line.

10. The method of claim 8, wherein the injecting the one or more illumination markers comprises injecting dry ice through a chemical distribution line.

11. The method of claim 8, further comprising adjusting at least one of a flow rate and a temperature of the chemical solution.

12. The method of claim 8, further comprising adjusting a fan speed of a fan filter unit positioned over the processing chamber.

13. The method of claim 8, further comprising illuminating the processing chamber with a helium-neon laser device.

14. A wet processing system, comprising:
    a processing chamber;
    a spray nozzle positioned within the processing chamber and configured to dispense a chemical solution over one or more wafers;

one or more chemical distribution lines configured to inject one or more illumination markers into the processing chamber;
one or more detectors positioned around the processing chamber and configured to obtain images representing locations of the one or more illumination markers; and
a processing system configured to:
 determine a trajectory of an illumination marker of the one or more illumination markers based on the images; and
 determine whether the determined trajectory is outside a predetermined trajectory range; and
 in response to the determined trajectory being outside the predetermined trajectory range, adjust one or more process parameters associated with the wet processing system, wherein the one or more process parameters comprise at least one of an angle of the spray nozzle, a height of the spray nozzle, and a lateral scanning speed of the spray nozzle.

15. The system of claim 14, wherein the one or more illumination markers comprise water vapor.

16. The system of claim 14, wherein the one or more illumination markers comprise dry ice.

17. The method of claim 14, further comprising adjusting at least one of a flow rate and a temperature of the chemical solution.

18. The method of claim 14, further comprising adjusting a fan speed of a fan filter unit positioned over the processing chamber.

19. The method of claim 14, further comprising illuminating the processing chamber with a helium-neon laser device.

20. The method of claim 14, wherein the images comprise a plurality of sets of images, and wherein the images in each set of the plurality of sets of images are obtained at a same time.

* * * * *